(12) United States Patent
Porter et al.

(10) Patent No.: US 6,229,392 B1
(45) Date of Patent: *May 8, 2001

(54) HIGH POWER SWITCH-MODE RADIO FREQUENCY AMPLIFIER METHOD AND APPARATUS

(75) Inventors: Robert M. Porter, Fort Collins; Michael L. Mueller, Loveland, both of CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/300,586

(22) Filed: Sep. 2, 1994

Related U.S. Application Data

(63) Continuation of application No. 08/098,356, filed on Jul. 30, 1993, now abandoned.

(30) Foreign Application Priority Data

Jan. 30, 1992 (WO) ................................. PCT/US92/00844

(51) Int. Cl.$^7$ ........................................................ H03F 3/38
(52) U.S. Cl. ........................................ 330/207 A; 330/251
(58) Field of Search .............................. 330/207 A, 251; 363/97, 131

(56) References Cited

U.S. PATENT DOCUMENTS

| | | |
|---|---|---|
| 3,919,656 | 11/1975 | Sokal et al. ............................. 330/51 |
| 4,449,174 | 5/1984 | Ziesse ..................................... 363/21 |
| 4,607,323 | 8/1986 | Sokal et al. ............................. 363/97 |
| 4,685,041 | 8/1987 | Bowman et al. ....................... 363/40 |
| 4,743,858 | 5/1988 | Everard ................................... 330/10 |
| 4,891,746 | 1/1990 | Bowman et al. ....................... 363/131 |
| 5,023,566 | 6/1991 | El-Hamamsy et al. .............. 330/251 |
| 5,187,580 | 2/1993 | Porter et al. .......................... 330/207 |

OTHER PUBLICATIONS

Herbert L. Krauss and Charles W. Bostain, Solid State Radio Engineering, Copyrighted 1980, New York, 394–412 and 448–454.

H.O. Granberg, Applying Power MOSFETs in Class D/E RF Power Amplifier Design, Jun., 1985, Cardiff Publishing, Co., 7–926 to 7–301.

Helge Granberg, RF Power MOSFETs, Copyrighted 1983, Garden City, New York.

Nathan O. Sokal and Richard Redl, Power Transistor Output Port Model, Jun., 1987, RF Design, p. 45–53.

Design Automation, Inc., HEPA–PLUS (User Manual), Copyrighted 1990 Design Automation, Inc., Lexington, MA, p. 4–26.

IXYS Corporation, San Jose, CA, IXYS Product Selector Guide, Unknown, Unknown.

IEEE Transactions on Circuits & Systems 37 (190) Aug., No. 8, New York; Julio C. Mandojana, et al.

*Primary Examiner*—Steven J. Mottola
(74) *Attorney, Agent, or Firm*—Santangelo Law Offices, P.C.

(57) ABSTRACT

Disclosed are both methods and a circuit to achieve powers of many kilowatts in radio frequency amplification using a switch mode amplifier in a new class of operation. In operation the invention utilizes internal switch characteristics. Methods create a substantial voltage step at the end of a response time period which allows greater output power without increasing the maximum switch voltage, reduces the maximum switch voltage for the same power, and which permits reduction of the stress on the switch element. Utilization of internal varactor capacitance avoids undesirable circulating currents and avoids the effects of lead inductance. The design allows use of less expensive components and high voltage switches not manufactured for radio frequency applications by preferring a substantial internal capacitance to establish maximum power. Other components of the network circuitry are also coordinated with the internal varactor capacitance. Adjustment of the conduction angle for optimum power and elimination of a need to bias the driver are also disclosed.

10 Claims, 4 Drawing Sheets

HIGH POWER SWITCH-MODE RADIO FREQUENCY AMPLIFIER METHOD AND APPARATUS

This is a continuation of application Ser. No. 08/098,356 filed Jul. 30, 1993, and now abandoned which claims priority from application Ser. No. 07/650,789 filed Feb. 4, 1991.

TECHNICAL FIELD

The present invention relates generally to the field of radio frequency (RF) power amplifiers, focusing on the aspects involved in the field when RF power amplifiers are utilized to generate high power outputs. More particularly the invention pertains to the narrow field of high power RF amplifiers having switching devices and configured similarly to those operating in a Class E mode.

BACKGROUND OF THE INVENTION

Radio frequency circuit design, unlike circuit design at the lower frequencies, is a field which involves an interplay between the theoretical and the practical. While it is characterized by the same fundamental theoretical relationships well known to almost any circuit designer, across the range of frequencies involved, practical effects also become important. As a result, circuit designers in this field are often required to simultaneously understand and apply the theory of operation of each device, the function of each device as it actually operates, and the ability to experimentally attempt and reconcile results achieved. In actually fashioning circuits and devices to achieve extreme levels of performance, this latter aspect—the ability to experimentally attempt and reconcile results achieved—becomes very significant as achievements seemingly straightforward from a theoretical basis become increasingly difficult to realize. In this regard, one of the challenges faced is that of understanding and utilizing the theoretical preconceptions while remaining open minded enough to go beyond the limits described by them.

The relevant field is also unique in that seemingly insignificant changes in existing circuitry can entirely change the operation of the device. As a result of this fundamental aspect, those skilled in the art have developed a shorthand technique by which several combinations of operating parameters and resultant conditions may be characterized and utilized. This shorthand technique is that of describing amplifiers in terms of classes of operation. To the RF circuit designer, in many cases, amplification circuits which are almost identically arranged and yet function very differently can be discerned by the simple characterization of the amplifier's "class" of operation. In application, these "classes" (referred to as Class A, Class B, etc.) have become an important tool to the RF amplifier designer. For example, by merely stating that an amplifier operates in the Class E mode, those skilled in the art are able to apply such a amplifier often without the need to fully calculate theoretically the effects of that amplifier in advance of its actual application. This design technique obviously has advantages. It does, however create limitations. As it applies to the present invention, one of these limitations is that it fosters the acceptance of some preconceptions and assumed restrictions which are now proven to be unnecessary and even erroneous.

In creating RF power amplifiers, some of the goals those skilled in the art have long sought are those of higher power (powers above a few hundred watts for a single stage device), higher efficiency, and greater simplicity to lessen the cost, components, and space required for the amplifier. Each of these challenges have been addressed by those skilled in the art to varying degrees. With respect to some of these a significant advance—and a new class of operation—was invented in 1975 through U.S. Pat. No. 3,919,656. This invention, now referred to as a "Class E" amplifier, typified invention in this field. Although that amplifier was configured almost identically to its prior art, through a new selection of parameters, its operation acted differently to achieve significantly improved results. This is also true of the present invention.

As an incident of the new class of operation, however, the teachings of the Class E amplifier also resulted in a new set of preconceptions and assumed restrictions. While many of these preconceptions and restrictions made sense at the time of the original Class E invention, they continued even after their original reason for being ceased. These included an almost dogmatically pursued desire for efficiency, a theoretical design model that ignored significant internal component characteristics, and an assumed restriction on the maximum amount of power possible. In overcoming each of these facets, the present invention achieves perhaps dramatic performance advantages. With respect to the aspect of maximum power, the present invention affords a dramatic improvement. Where the prior art devices were capable of claiming the ability to consistently produce power in the range of two hundred watts and in isolated instances produce 1000 watts, without yet having identified its upper limits, the present invention can easily produce many times this amount. Where the prior art devices required the use of expensive RF switching devices in order to achieve their levels of performance, the present invention requires only inexpensive switches to achieve similar performance levels. Where the prior art devices rigidly adhered to achieving efficiency through the constraint of pursuing zero voltage at the instant of switch turn-on, the present invention departs sharply to teach a substantial voltage at such time. Perhaps most importantly, however, the present invention discloses a more accurate method of designing high power RF amplifier circuitry whereby a broad variety of improvements in performance can be achieved and whereby each of these improvements may be optimized for different applications.

Certainly other developments have attempted to improve the original Class E amplifier. In 1984, U.S. Pat. No. 4,449,174 recognized in a somewhat different field that the internal capacitance of the switch was significant for some circuits. In contrast to the present invention, however, it applied this aspect in a manner which reinforced the preconception that efficiency is paramount and can only be maintained through the zero voltage constraint at the instant of switch turn-on. That those skilled in the relevant art continued in this preconception is clear. In the 1987 RF Design article by one of the well-respected original Class E inventors entitled "Power Transistor Output Port Model," those skilled in the art were told not to stray from the zero voltage condition. In 1988 U.S. Pat. No. 4,743,858, in proposing the use of a diode for better device utilization for the Class E amplifier, again reiterated the desire to avoid voltage at the instant of switch turn-on.

The seemingly simple recognition that internal aspects of the switch were important did not alone lead to the present invention. After the 1984 patents lead, the 1985 Motorola RF Device Data article entitled "Applying Power MOSFETs in Class D/E RF Power Amplifier Design" by Helge Granburg not only presented the power level limits thought to be practically achievable (power level limits many times less than those possible through the present invention), but it also lead those skilled in the art to ignore important effects of lead inductance which were to have significant impacts on the design of the present invention. In addition, in the 1990 U.S. Pat. No. 4,891,746 in a field similar to the 1984 U.S. Pat. No. 4,449,174, the continued adherence to efficiency even taught those skilled in the art away from the important aspect of a voltage step. Although arguably in a different field, this art may have lead those skilled in the present field away from the aspect of maintaining a positive voltage across the switch which also becomes paramount at the higher power levels.

As can be seen, each of these prior efforts actually taught away from directions taken by the present invention and served to reinforce attitudes which in essence limited prior designs. This was true even though there was a well-known and long-felt need to achieve the performance of the present invention. While those skilled in the art appreciated the goals of the present invention, their attempts to achieve such goals were inadequate because they failed to recognize the effect of their preconceptions. Even the unexpectedly simple and seemingly minor modifications presented by the present invention appears to have lead those skilled in the art to assume the direction taken by it would not yield the sometimes dramatic improvements achieved by it. This may also have been reinforced by the prior feeling that since an incremental increase in performance was difficult, a significant leap in performance was also difficult. By breaking from traditions long adhered to in the relevant art, the present invention proves this completely incorrect.

DISCLOSURE OF INVENTION

The present invention discloses a technique and device to amplify and generate a high power radio frequency signal. Rather than affording an incremental increase in performance over the prior art, the invention utilizes techniques and circuitry which were previously considered undesirable to achieve significant leaps in performance and other criteria compared to the prior art. It also allows for different modes of operation whereby goals such as power, size, cost, and reliability can be optimized depending upon the particular application.

In general terms, the invention involves both methods and embodiments of an apparatus. Each of these achieve several different objects which, when combined, act to achieve the mentioned leaps in performance. In one embodiment, the invention discloses a switch-mode RF amplifier which creates a substantial voltage step at the end of the non-conductive time period to achieve different results ranging from allowing more RF power to be generated to allowing a less expensive switch to be used. In another embodiment, undesirable internal switch characteristics are actually utilized in a uniquely desirable way to minimize problematic RF effects at the higher frequencies and powers such as in the HF range. In another embodiment, the undesirable internal switch characteristics are used to lessen sensitivity of the amplifier to tuning. In yet another embodiment, designs are used which simplify and lessen the space, and increase the power densities, required for RF amplifiers.

Importantly, the invention breaks from several time-honored traditions in RF power amplification. While drawing from some of the operating conditions used in Class E operation, the invention expands upon these conditions in a manner which could be characterized as a new, unique class of operation. With simpler circuitry, the invention teaches the selection and coordination of network components to allow a voltage step in the response waveform and to eliminate a current loop previously utilized. By recognizing and utilizing (rather than avoiding or compensating for) the inherent characteristics in realistic switches, the invention achieves its goals.

Accordingly, a general object of the present invention is to provide techniques and devices which achieve performance with respect to a variety of criteria. In keeping with this broad goal, it is an object of the invention to allow optimization to each application as desired.

One object of the present invention is to provide an RF power amplifier which can achieve power levels beyond the limits of those experienced by the prior art devices. In achieving the leap in power levels, an object is to maintain reliability standards consistent with or above those existing for the prior art. The invention also is designed to avoid the creation of unusual limitations peculiar to the design and allows operation with frequency sensitivities consistent with the prior art devices.

It is also a general object of the present invention to provide designs and techniques which afford manufacturing and commercial advantages. Another object of the present invention is to reduce the complexity and number of components required in the amplification circuitry. In achieving this goal, the invention has several different goals and objects. Practically, it is an object to allow a design which is less expensive to manufacture. This is achieved both through the use of fewer components and the use of even less expensive individual components. For some applications, it is an object to provide a design which is smaller. Naturally this may enhance the scope of application of such amplifiers.

Another object of the present invention is to overcome the limitations encountered in some operating parameters. At higher frequency and power, the effects of circulating currents have previously posed limitations. The present invention overcomes these limitations and as a result allows performance leaps. An object in this regard is to minimize circulating currents and improve output form.

Yet another object of the present invention is to accommodate existing switch designs and limitations. In achieving this object, the invention not only avoids the need to overcome switch limitations, but actually utilizes the inherent characteristics of a practical transistor switch to achieve its performance abilities. One of the modes in which the present invention can be configured acts to address the voltage breakdown limitations found for many switches. In so doing it has as an object the reduction of the voltage to which the switch is subjected. The invention also allows designers to recognize the impact of the inherent characteristics of practical switches. An object of the invention is to disclose to designers the relationship between switch characteristics and circuit performance. Once the character of the switch is determined, the designer may coordinate all of the circuit's other components to optimize a variety of operating parameters.

It is also an object of the invention to allow for ways in which power may be maximized without changing components of the circuitry. Recognizing that not all performance parameters can be accurately predicted by current theoretical understandings, an object is to allow practical implementation in different applications and embodiments.

A further object of the invention is to provide techniques and designs whereby trade-offs may be accepted by the designer to optimize specific performance parameters depending upon application. In this regard, an object is to utilize some trade-offs, one example being that of efficiency, in a manner that allows offsetting gains such that the result in only minor changes and yet still realizes the performance advances desired.

Naturally, further objects of the invention are disclosed throughout other areas of the specification and claims.

BEST MODE(S) FOR CARRYING OUT THE INVENTION

Figure 1:
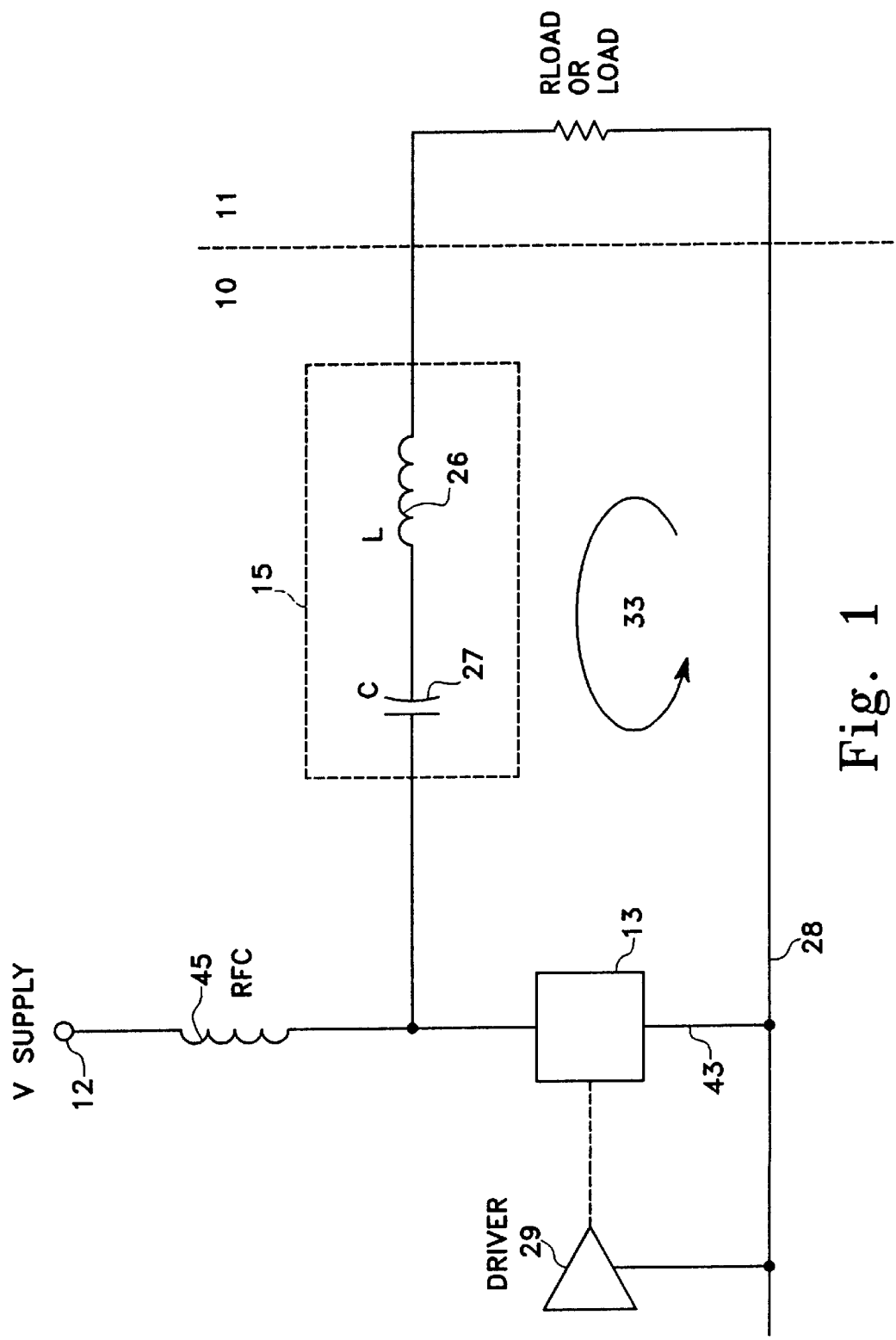
FIG. 1 is a circuit diagram of an embodiment of the invention.

As can be seen from the drawings, and in keeping with an object of the invention, the basic concepts of the present invention are easily implemented. FIG. 1 shows the present invention as it is currently configured. In understanding the degree to which this new circuit and the potentially new class of operation can be varied, it should be understood that at present, the performance boundaries have not yet been established. Accordingly, it is anticipated that refinements to the present understanding may continue to be added and additional performance achieved. By virtue of the fact that the present invention embarks in a completely new direction, it should be understood that such refinements and improvements will fall within the scope of the present invention and its claims.

Referring to FIG. 1, it can be seen that the invention is most simply characterized as a single loop RF power amplifier in which power amplifier (10) is combined with load (11) to create network current loop (33). Although shown schematically as a resistor, it should be understood that load (11) may be any device which utilizes power and may have its own reactive aspects as well. In addition, it should be understood that this power may be supplied either in a continuous, pulsed, or even amplitude modulated manner. External to network current loop (33) are the well-known elements (shown in schematic) of voltage supply (12) and radio frequency driver (29). As is also well-known to those skilled in the art, voltage supply (12) includes RF choke (45). Network current loop (33) includes reactive network circuitry (15) including, in simplified form, serially-connected inductor (26) and separate capacitor (27). These are also serially connected to switch (13). Switch (13) and load (11) are connected to common voltage reference (28) to complete network current loop (33). In this manner, switch has common lead (43) well defined.

Although the amplifier can be arranged to look very similar to a Class E amplifier, it functions differently in many regards. [Much like the original Class E amplifier does with respect to its predecessors.] Like a Class E amplifier the present invention has inherently high efficiency and is relatively simple. Class E amplifiers in general, however, are designed such that when the switch transitions from "off" (its non-conductive state) to "on" (its conductive state) the voltage across it is essentially zero during the switching transition. This is in sharp contrast to the present invention. While in Class E operation, this condition is desired to minimize turn-on or step losses, an exactly opposite condition—that of a substantial voltage step—is desired by the present invention to achieve performance improvements. In Class E operation, the network causes the waveform across the transistor to approach both a zero voltage and a zero slope at the end of the "off" state. The present invention does not require these restrictions. As a result, all aspects of the circuit may be optimized for high output power. The result is a single stage RF amplifier which may operate efficiently at power levels of many kilowatts.

Figure 2A:
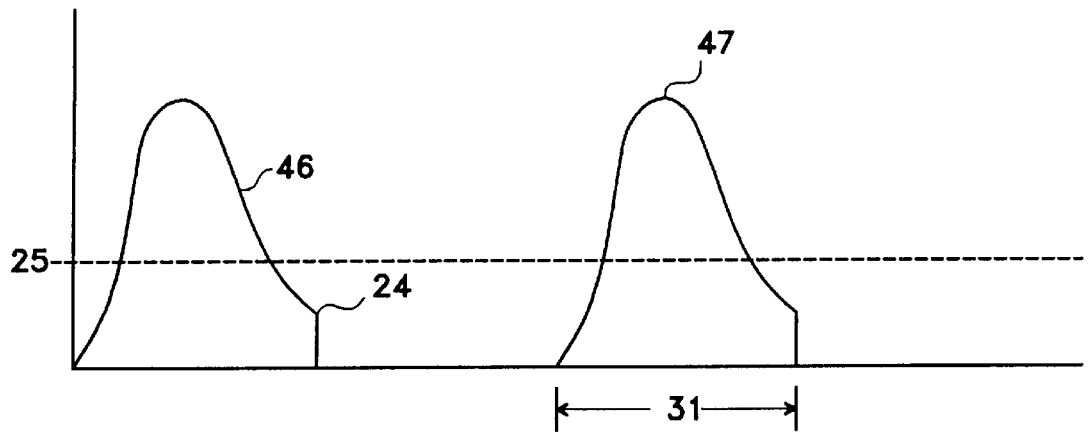
FIGS. 2a and 2b are representations of the voltage and current waveforms during the response and conductive time periods, respectively.
Figure 2B:
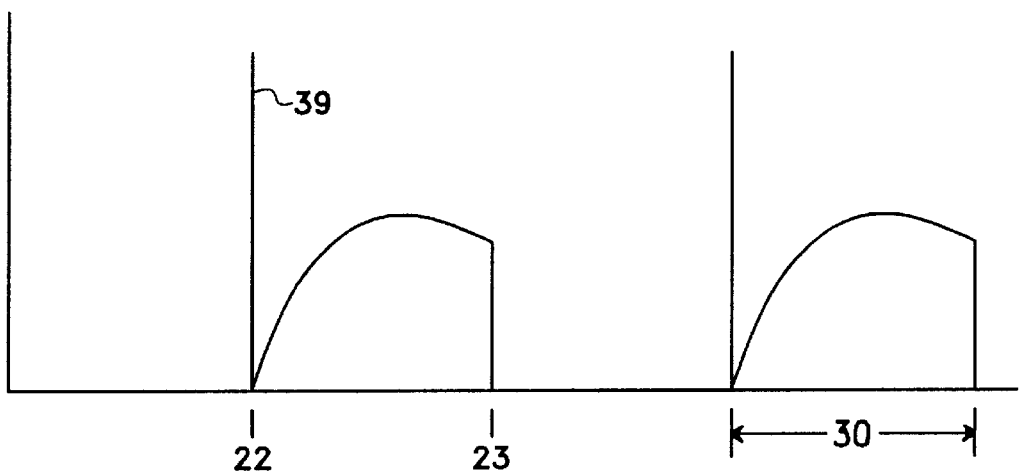

This new class of operation and its differences from the prior art may be further understood with reference to FIGS. 2a, 2b, 3a, 3b, and 4. Referring to FIGS. 2a and 2b, it can be seen that both voltage and current waveforms for switch (13) are shown during its conductive and non-conductive states. Starting with conductive time period (30), it can be seen that at turn-on time (22), current begins to flow through switch element (14) of switch (13) in a manner which creates current waveform (44). Current waveform (44) is thus conditioned by network current loop (33) as well as voltage supply (12) and radio frequency driver (29). As is well-known, current waveform results from the energy provided by voltage supply (12) while switch is in its conducting state. This energy is to some extent stored in inductor (26) and separate capacitor (27) to cause response voltage waveform (46). As is explained later, current waveform (44) in this class of operation includes current spike (39) in all cycles after the initial cycle which is not shown. Current waveform (44) is abruptly driven to zero at the end of conduction time period (30) by the transition of switch (13) to its non-conducting state at turn-off time (23). This transition is accomplished rapidly such that no significant active region exists in the switch transition. Some slope is shown, however, since practical devices do require some time to transition. This type of rapid transition, commonly referred to as the switching mode of operation or switch-mode, the operation of switch (13) is utilized very differently than when the active region (the regime in which the switch acts only partially open) causes the desired effect. In making the transition between states, it should be understood that by driving switch (13) through the use of greater than necessary voltages, less expensive, slow acting switch devices may be used.

Immediately after the transition of switch (13) to its non-conducting state, the energy stored in inductor (26), separate capacitor (27), and otherwise within network current loop (33) acts to create response voltage waveform (46) across switch (13), specifically across varactor capacitor (38), for response time period (31). Response voltage waveform (46) is thus conditioned by the components in network current loop (33) and as shown is time-varying as desired to obtain the appropriate output result. During this time, response voltage waveform (46) reaches a maximum response voltage (47) which is relative to supply voltage (25). As mentioned earlier, in this class of operation, response voltage waveform (46) is such that at the end of response time period (31) or the time immediately prior to turn-on time (22), a substantial voltage step (24) remains. When switch (13) is next caused to transition to its conducting state, the energy caused by voltage step (24) acts to cause previously mentioned current spike (39).

Figure 3A:
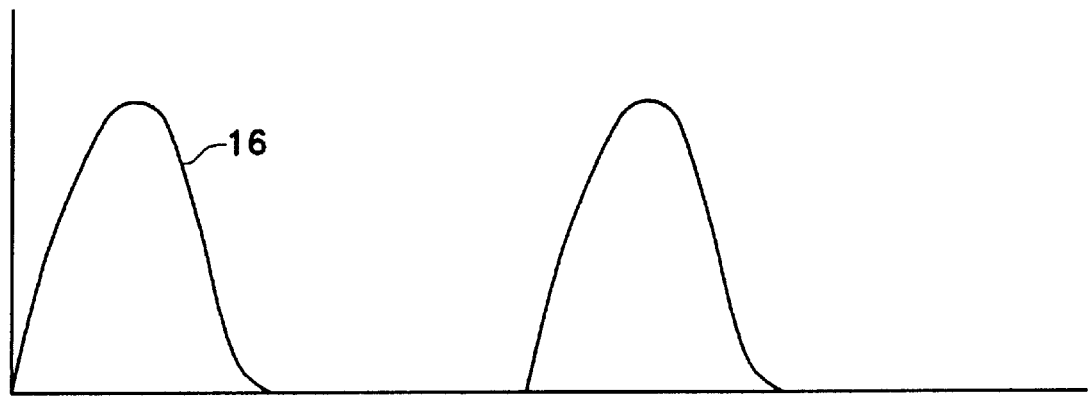
FIGS. 3a and 3b are representations of the voltage and current waveforms of prior art devices during the response and conductive time periods, respectively.
Figure 3B:
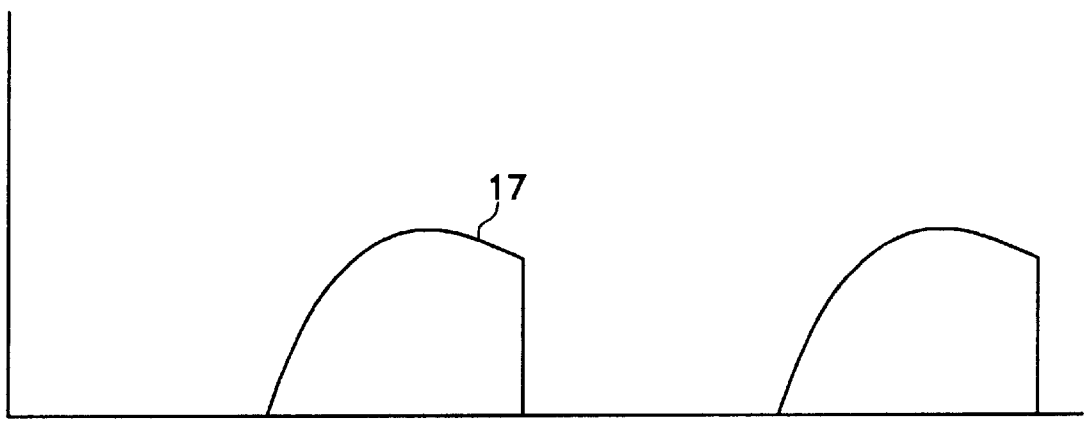

Comparing this sequence of events with those shown in FIGS. 3a and 3b for a Class E RF amplifier, the differences between this class of operation and the Class E mode of operation can be readily understood. As can be seen in FIGS.

3a and 3b there exists both Class E current waveform (16) and Class E voltage waveform (17). Importantly, in Class E operation, the choice of circuit elements and conduction angle forces the voltage to be zero at a time immediately prior to turn-on time (22). As a result, no current spike exists in Class E operation. This avoids assumed "significant" power losses associated with such a current spike, as previously desired by those skilled in the art as such avoidance was presumed to allow for improvements in efficiency. As can be seen in FIG. 3b, the shape of Class E voltage waveform (17) initially rises and finally falls more rapidly than that shown in FIG. 2b. In addition, the height of current waveform (44), not including that of current spike (39), will also be lower than that of corresponding Class E current waveform (16) for the same maximum response voltage (47).

In regard to the operation of the present invention there are several things to note. First, there is indeed some loss in the switching device due to current spike (39). The amount of this loss is dependent upon internal conditions which realistically exist in practical switches, namely, the internal capacitance of switch (13). Second, current spike (39) does subject switch (13) briefly to more extreme conditions than that of a Class E amplifier. This is also dependent upon internal conditions which realistically exist in practical switches and is an effect which can practically be accommodated. As may begin to be understood, the present invention was required to incorporate not just a theoretical model of the amplifier's operation, but it was also required to incorporate practical considerations of devices as they actually exist. In this way it was able to achieve its performance improvements over the prior art.

Achieving high power from a single switch RF amplifier is theoretically straightforward when utilizing an ideal switch. In order to approximate the results achieved while using practical switches, however, internal capacitance (including voltage-variable, or varactor capacitance), lead inductance, voltage limitations, and "on" resistance must be added to the switch model. In cases where the switch utilized is a field effect transistor (FET), the internal reverse diode must also be considered. In trying to obtain power levels of many kilowatts from a circuit using a single switch, many of the non-ideal characteristics of the switch must be known and accounted for in the circuitry and operation of the switch-mode radio frequency (RF) amplifier. Some of the limiting factors for obtaining high power levels at high frequencies have not yet been identified in many Class E RF amplifiers. New concepts are required to obtain these higher output powers.

Figure 4:
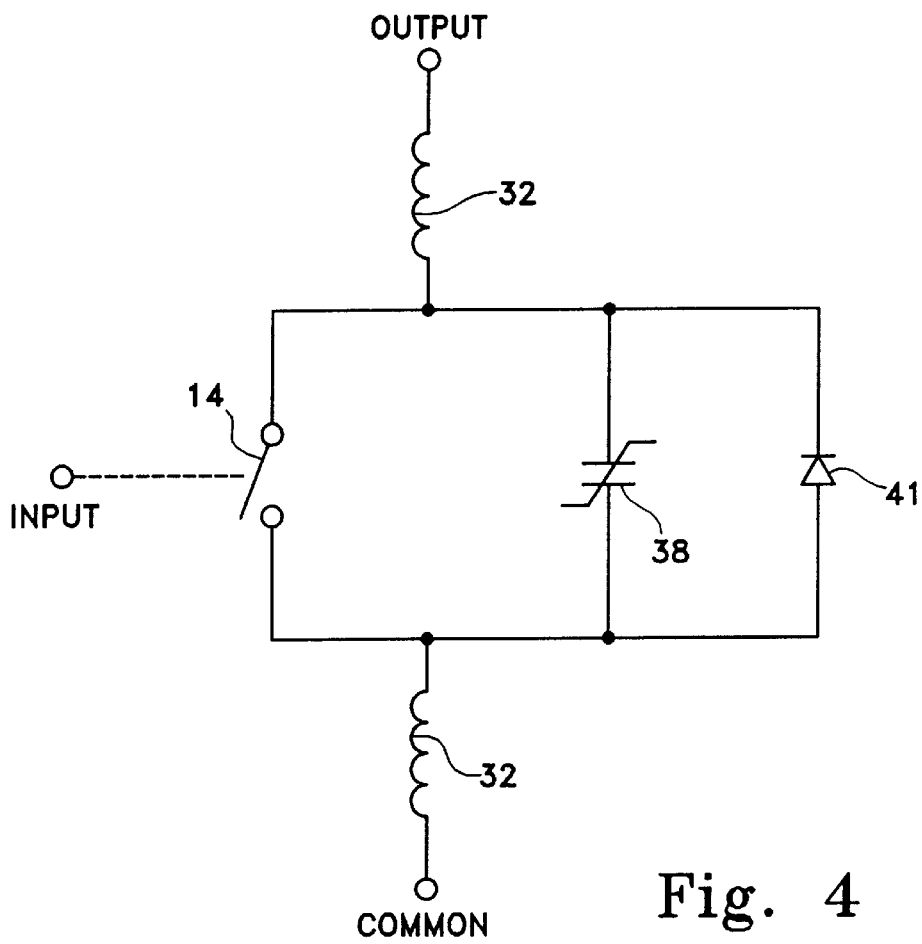
FIG. 4 is a schematic representation of a realistic FET switch device.

A practical transistor switch (as currently designed), whether a bipolar device or an FET, has numerous particular electrical characteristics, several of which are important to the present invention. Referring to FIG. 4, a schematic representation of a realistic FET switch device, three of these characteristics can be seen. First, such a switch includes several capacitance elements. The most important of these is shown in FIG. 4 as varactor capacitor (38) which exists parallel to switch element (14). Second, parallel to varactor capacitor (38) within a FET switch there exists reverse diode (41). Importantly to some aspects of the present invention, and as described later, it should be understood that reverse diode (41) is such that it can be subject to failure if rapidly transitioned from negative to positive voltage. Third, and also important to other aspects of the present invention, the common and output (non-drive) connections of switch (13) include lead inductances (32). These are uniquely accommodated by the present invention and play an important part in developing the initial theoretical understanding of the function of the present invention. With respect to this understanding, it should be understood that many aspects of the invention may vary as switch and other component design evolves. In this regard, it should be understood that such variations will fall within the scope of the present invention, its essence lying more fundamentally with the design realizations and discoveries achieved than merely the particular circuit designs developed.

With respect to varactor capacitor (38), it should be understood that this type of internal capacitance varies as a function of the output voltage. The internal output varactor capacitance changes inversely proportional to the square root of the voltage across it for any significant voltage. Since in many single switch RF amplifiers this capacitance is a significant component in the circuit, the resulting output voltage waveform is significantly affected.

In prior art Class E amplifiers, the theoretical ratio of the peak voltage across the switch to the supply voltage for optimum Class E operation is approximately 3.56:1, assuming constant output capacitance. This is only true for a switching device whose output capacitance is fixed with respect to the voltage across it; it is not true when varactor capacitor (38) is in fact present. In such a case, this ratio is actually higher, thus such devices would (prior to the present invention) have dictated lower power outputs. In regards to the present invention this aspect alone may have lead those skilled in the art to assume that in order to supply similar power levels and loads, a switch having an internal varactor capacitor (38) would require maximum response voltage (47) more than 25% higher than that for a constant output capacitance. Therefore, for a maximum allowable peak voltage across a switch utilizing only the varactor capacitance, prior theory would have lead those skilled in the art to believe that it was not possible to achieve the theoretical output power of a Class E amplifier.

In sharp contrast to such predictions, the use of varactor capacitor (41) as the only capacitive circuit element which is parallel to the switch actually provides the advantage of reducing the slope of the response voltage curve at turn-off of the switch. This reduces the power dissipated in the switch during its turn-off transient, as the instantaneous product of the voltage across it and the current through it during the turn-off period is reduced by the reduction of the slope.

Figure 5:
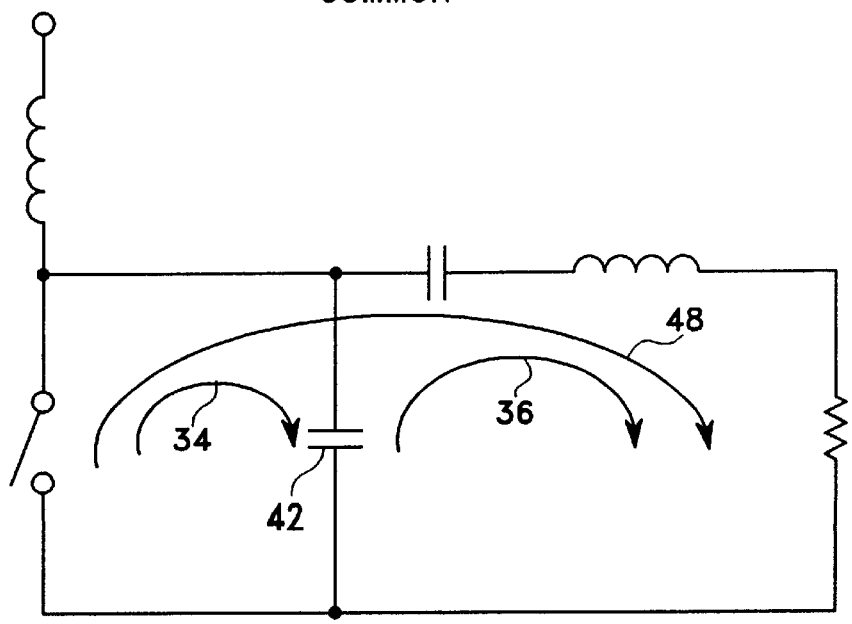
FIG. 5 is a circuit diagram of the typical prior art device showing the current loops which exist.

Naturally, the effect of varactor capacitor (38) on response voltage waveform (46) can be lessened by providing an external fixed capacitor across the output of the transistor as shown in the original Class E patent. As a result, for the same loading and output power, the voltage across the switch will not be as great as it would with varactor capacitor (38) alone. Referring to FIG. 5, a disadvantage of paralleling an external fixed capacitor in an attempt to obtain multikilowatt power levels at high frequencies can be seen. This is due to the effect of switch current loop (34) which the parallel capacitor creates. It can be seen that when such a configuration is pursued, an additional loop, switch current loop (34), is created defined by the switch's varactor capacitor (38), its lead inductances (32), and the external capacitor (42). Thus in prior art devices utilizing external capacitor (42) the designer need not only contend with the effects of a single network current loop (33), but rather with its equivalent, the prior art main network current loop (48), switch current loop (34), and load current loop (36). While there certainly may exist some minor current loops in the actual circuit of the present invention, they are not significant—that is they do not adversely affect performance in the desired regimes—in the manner that the several loops of the prior art do. Thus the present invention has only one significant current loop and its design acts to minimize any undesirable circulating currents and current loops.

It should also be understood that lead inductances (32) are internal to the transistor as well as external, so only a portion of it may be controlled. Potentially harmful circulating currents will be generated through the switch as a result of this additional loop. This is especially true at high power levels where the maximum possible output power will be limited due to excessive currents through the switch. This effect is, of course, also more significant as the frequency is raised. Although the addition of another loop in the circuit may not be significant at low power levels, it can become a limiting factor at higher power levels. Conversely, without external capacitor (42), lead inductances (32) may simply be included in the series inductance value required in the conditioning circuitry. Instead of adding the additional component of external capacitor (42), the present invention affirmatively utilizes varactor capacitor (38) to achieve its function.

By use of hybrid technology to manufacture switch (13), a fixed capacitor could of course be placed immediately adjacent to the die, reducing the inductance between the internal die capacitance and the external fixed capacitance (the latter is not shown schematically). Although this will significantly lessen the effect of the undesired switch current loop (34), other power limiting problems will result from the interconnect required to parallel the fixed capacitor across the die.

As mentioned earlier, FETs are often used as switching transistors. As a consequence of their construction these include reverse diode (41). This element is actually a parasitic bipolar transistor which is forward biased when the output voltage drops below the common voltage reference. Stress on, even failure of, this transistor (acting in essence as reverse diode (41)) can result if the rate of voltage rise across the device (dv/dt) exceeds the capability of the transistor. In general, for Class E amplifiers, this type of stress can be ignored since the output power or fundamental frequency of operation is low, and therefore the rate of change of voltage across the device rarely approaches this limitation. As either power or frequency is increased, however, this aspect can become important and even limiting. The dv/dt stress can limit the output power enabled by the FET switch by limiting the output voltage that the transistor is capable of generating reliably.

The dv/dt rating of a device is usually broken up into two different categories, static and commutating dv/dt. The static dv/dt rating applies when the internal diode is reverse biased. The commutating dv/dt rating results from applying reverse bias to the diode before it has had time to fully recover from a previous forward bias condition. In present devices, the static dv/dt capability is approximately three to four times greater than the commutating dv/dt capability. For maximum output voltage across a given FET at a frequency which is high enough to risk stressing a device due to the dv/dt limit, it is critical that the device's output voltage remain at or above the common voltage reference to avoid forward biasing the internal diode and thus taking advantage of the higher static dv/dt rating. If the output voltage falls below the common voltage reference and forward biases the internal diode, the lower commutating dv/dt rating may be exceeded when the output voltage again rises rapidly across the switch.

In understanding the synergistic advances which together combine to allow the performance improvements of the present invention, it is important to note that utilization of varactor capacitor (38) as the capacitor element required across the switch in the switch-mode RF amplifier circuitry will reduce the dv/dt stress by approximately 20% for the same peak voltage across the device. This is also significant when trying to achieve higher power levels at high frequencies.

Despite the prior teachings and preconceptions, the present invention achieves a reduction in the effects that varactor capacitor (38) has on the peak voltage ratio by allowing the output voltage level just prior to the start of conduction to remain substantially higher than zero, even to levels greater than 20% of the supply voltage. This voltage step, which was found in one embodiment to offer the most optimum set of conditions at 50% of the supply voltage, addresses several of the concerns raised when no fixed external capacitor (42) is placed in parallel with varactor capacitor (38).

An advantage derived from the introduction of voltage step (24) is that if desired, maximum response voltage (47) can be decreased. When voltage step (24) is equal to approximately 50% of the supply voltage, it has been found that the peak voltage and output power are reduced in possibly an optimum manner from that of the prior art Class E amplifier. Conversely, when the supply voltage is then increased so the peak voltage of the waveform with the step is returned to the maximum capability of the peak voltage of the prior art Class E amplifier, the resulting output power for the same approximate loading is notably greater. In this manner, the components of network current loop (33) and power supply (12) act as a means for maximizing or increasing the power output of the amplifier while maintaining the same maximum response voltage (47) on switch (13). In assessing the optimum ratio or value of voltage step (24), it should be understood that theoretical understanding has not yet been developed, thus broad variation may be desirable. While at present, it is believed that a value of approximately 50% of the supply voltage represents an optimum value, it is also believed that some advantages can be achieved with a smaller, but still substantial voltage step, namely one in which the losses would be considered significant and undesirable by those skilled in the prior art. At present it is also believed that meaningful improvements in performance exist at values above about the 20% level. How closely this level is determined will, of course, be determined by the level at which improved performance is possible for the particular application.

Allowing for a substantial voltage step across the switch immediately prior to conduction also prevents the possibility of forward biasing the FET internal diode, increasing the effective dv/dt stress capability. The optimum Class E amplifier creates a positive voltage waveform across the switch when the switch is off that is substantially sinusoidal prior to the start of conduction, and which decays at a zero slope to zero volts at the start of conduction. Tuning for this type of waveform has been taught in the prior art to be critical. Since harmonic currents flow in most practical circuitries, the waveform prior to conduction can produce a slightly non-zero voltage and/or non-zero slope waveform. If the voltage across the switch even slightly reverses and allows the internal reverse diode to conduct, and if the reverse recovery time of the internal diode is greater than the time of conduction, then upon turn-off of the transistor the rising voltage across the transistor will cause the diode to commutate, and the resulting lessened dv/dt capability of the device may cause a failure in the transistor long before maximum voltage limitations become important.

This effect can also be caused in other ways. Since the shape of both response voltage waveform (46) and Class E voltage waveform (17) are both fairly sensitive to the load, a slightly changing load impedance can cause the waveform of a prior art Class E amplifier to swing below zero, again causing the internal diode to conduct with the associated loss in dv/dt rating and possible failure of the device. By allowing a substantial voltage step (24) just prior to the start of conduction, response voltage waveform (46) is assured to be positive, even during slight load variations, therefore decreasing the possibility of dv/dt failure of switch (13). As mentioned earlier, the problem of device failure due to the voltage rise during diode commutation is particularly important at higher power levels. Operating the circuit at higher frequencies also increases the dv/dt across the switch, making the need to avoid forward biasing of reverse diode (41) also important in this case. Switch (13) is of course less likely to experience failure at lower power levels or lower frequencies.

As mentioned earlier, at the initiation of conductive time period (30), the voltage across switch (13), and therefore across varactor capacitor (38), will discharge quickly creating some turn-on switching losses. This can be calculated as approximately $\frac{1}{2}CV_{step}^2 f$, where C is the capacitance at $V_{step}$, the final voltage prior to turn-on, and f is the operating frequency. This produces a current spike through the switch which can be much higher than the nominal peak current through the switch. Since the switching time of the switch is not zero, the peak of the current spike will not exceed the peak current ratings of a properly selected device, and the temperature rise of the switch due to the high momentary current can be made to be insignificant due to the short time it takes the circuit to discharge varactor capacitor (38). In contrast to the teaching of the prior art, it has been found that these step losses attribute only a small drop in efficiency, perhaps only a few percent. However, to compensate for this loss, it has been discovered that the addition of voltage step (24) has the effect of lowering the average current through the switch thus lowering conduction losses for the same conduction angle. This reduction of conduction losses does not theoretically entirely make up for the additional losses incurred in the switch itself. However, in practice, experimental amplifier circuits have shown little overall change in efficiency when the step is introduced. In fact, improved efficiency has been demonstrated by introduction of the voltage step. This may be surprising to those skilled in the prior art because of their concentration on losses in the switch element itself. The lower average current in the circuit reduces the losses in the other circuit elements by amounts more than enough to compensate for the slightly increased switch losses resulting in the observed increase in efficiency.

The teachings of the prior art also stressed the importance of maintaining exactly 180 degree conduction angles. In fact, when voltage step (24) is incorporated, the conduction angle may be adjusted below 180 degrees to optimize the voltage and current stresses presented to switch (13). As the conduction angle is decreased, the peak current through the switch is increased while at the same time the peak voltage across switch (13) is decreased. Naturally, different switches may display different optimum conduction angles. When coordinated with the supply voltage of voltage supply (12), varactor capacitance (38), reactive network circuitry (15), and load (11), a higher power may be obtained by adjusting the conduction angle below 180 degrees. The particular electrical characteristics of switch (13) may determine the optimum conduction angle.

One of the important aspects of switch (13) when used for the generation of high power RF energy is the relationship between its varactor capacitor (38) and its maximum output voltage rating. For high voltage FET's, varactor capacitor (38) (otherwise known as output capacitance, drain to source capacitance, or Coss) measured at any particular drain and gate voltages is primarily a function of die size with a less strong relationship to breakdown voltage—the voltage above which the switch will either fail or become unreliable. Naturally for the present invention, a higher breakdown voltage together with higher output capacitance is desired for higher power operation. To achieve improved performance, a substantial varactor capacitor (38) may be selected. By substantial, it is meant that rather than selecting switch (13) in a manner which minimizes the value of this component, the switch would actually be selected for the highest value in relation to the trade-offs possible in the breakdown voltage and other aspects. Surprisingly, it has been found that even switches with breakdown voltages above a level at which RF utilization was previously assumed to be inappropriate—about a 400 volt level—work well in the present invention. In considering such breakdown levels, it should be understood that not just manufacturer's specifications can be relied upon with respect to this aspect. Rather, the switch's actual function is the key aspect since ratings are often based upon considerations beyond actual performance.

In the circuit of the invention, only the internal varactor capacitance of the switch itself is used for the tuning of the output circuit. For a given frequency of operation, conduction angle, and specific transistor type, the value of varactor capacitor (38) and the maximum allowable output switch voltage or breakdown voltage will determine all other parameters of the output circuit, including inductor value, series capacitor value, load resistance, maximum supply voltage, and output power. Thus each of these are uniquely coordinated to the internal capacitance of switch (13) and selection of switch (13). The internal capacitance of switch (13) acts to establish the parameters of frequency and power optimally possible.

It is the nature of amplifiers of this type that the output power varies as the square of the supply voltage, while the output impedances usually vary directly with the output capacitance. This makes simple scaling to achieve higher powers a difficult task. To apply the teachings of the present invention, consider the possibility of increasing the power of a typical amplifier operating with a maximum swing of 80 volts on a 100 volt transistor producing an output power of 200 watts with an efficiency of 90% by replacement of the output transistor with a 1000 volt transistor with approximately the same die size. For a typical FET the output capacitance would decrease approximately four times due to the change in voltage rating. For the same class of operation this would typically also result in all impedances being scaled up by four times. Without an increase in supply voltage, this factor would cause the output power to initially be decreased by four times, not increase as desired. Since now the power supply voltage could be increased by 10 times causing a power increase of 100 times, the final circuit with both voltage level and impedance changes would therefore theoretically allow an output capacity of about 5000 watts. Obviously there are smaller incremental steps of increased voltage and power, but each step represents a significant power increase with all of the attendant problems to solve.

To reach such high power levels several problems must be simultaneously solved, however. These include dealing with increased power dissipation, dv/dt switch limits, layout, and parasitic loops. The method and circuit of the invention provide solutions for attaining such previously unattainable power levels from this simple circuit whenever the appropriate switch is available.

To achieve the performance improvements, one embodiment of the invention uses available packaged FETs. In this embodiment it is important that several small die type devices be used and mounted in a symmetrical configuration with the most compact layout possible. Another embodiment of the invention uses a hybrid module containing several small FET dice, with drain-to-source ratings between 400 volts and 1000 volts. Naturally, the higher voltage dice enable the circuit to yield higher powers. In either case, there is a unique relationship between output capacitance and maximum output power which can be obtained by coordination of the circuit element values as described earlier.

In the preferred experimental circuit, the topology appears nearly identical to many series resonant circuits such as mixed-mode Class C or Class E RF amplifiers. The distinctive elements are the drive, conduction angle, voltage waveforms, switch type, and output circuit values. These together act to produce very different operational modes and very improved performance. The drive circuit is designed to provide five to ten amps rms into a capacitive load. In the experimental test circuit an "L" network was used on the output to transform the load impedance to about 50 ohms.

The foregoing discussion and the claims which follow describe the preferred embodiments of the present invention. Particularly with respect to the claims, it should be understood that changes may be made without departing from its essence. In this regard, it is intended that such changes would still fall within the scope of the present invention. It simply is not practical to describe and claim all possible revisions to the present invention which may be accomplished. To the extent such revisions utilize the essence of the present invention, each naturally fall within the breadth of protection encompassed by this patent. This is particularly true for the present invention since its basic concepts and understandings are fundamental in nature and can be broadly applied.

We claim:

1. A method of producing high power radio frequency signals from a switch-mode power amplifier to power a load comprising:
   a. providing a supply voltage to a switch having internal capacitance and capable of rapidly transitioning from a conductive state to a non-conductive state, wherein said internal capacitance of said switch comprises an internal varactor capacitance; while
   b. causing said switch to rapidly transition to its conductive state and to remain conductive for a conductive time period during which said supply voltage causes current to flow through said switch; then
   c. conditioning the current flowing through said switch by reactive network circuitry during said conductive time period; then
   d. causing said switch to rapidly transition to its non-conductive state and remain non-conductive for a response time period during which voltage appears across said switch; then
   e. creating a response voltage waveform through action of said reactive network circuitry, and wherein said response waveform has a time-varying voltage throughout said response time period; then
   f. again causing said switch to rapidly transition to its conductive state at a turn-on time and thus recommencing the conduction time period wherein the voltage immediately prior to said turn-on time is substantial.

2. A method of producing high power radio frequency signals from a switch mode power amplifier as described in claim 1 wherein said internal varactor capacitance is substantial.

3. A method of producing high power radio frequency signals from a switch mode power amplifier to power a load comprising:
   a. providing a supply voltage to a switch having internal capacitance and capable of rapidly transitioning from a conductive state to a non-conductive state; while
   b. causing said switch to rapidly transition to its conductive state and to remain conductive for a conductive time period during which said supply voltage causes current to flow through said switch: then
   c. conditioning the current flowing through said switch by reactive network circuitry during said conductive time period; then
   d. causing said switch to rapidly transition to its non-conductive state and remain non-conductive for a response time period during which voltage appears across said switch; then
   e. creating a response voltage waveform through action of said reactive network circuitry, and wherein said response waveform has a time-varying voltage throughout said response time period, and wherein the voltage of said response waveform at said turn-on time is approximately 50% of said supply voltage; then
   f. again causing said switch to rapidly transition to its conductive state at a turn-on time and thus recommencing the conduction time period wherein the voltage immediately prior to said turn-on time is substantial.

4. A high power, switch mode radio frequency power amplifier to provide power to a load comprising:
   a. a radio frequency driver;
   b. a means for switching responsive to said driver wherein said means for switching operates rapidly and is capable of alternatingly establishing a conductive state for a conductive time period and a non-conductive state for a response time period, and wherein said means for switching further comprises an internal capacitive means, and wherein said internal capacitive means comprises a varactor capacitor;
   c. a means for providing a supply voltage to said switch;
   d. a means for conditioning responsive to said supply voltage wherein said means for conditioning acts to create a response voltage waveform wherein said response waveform has a time-varying voltage during said response time period and wherein said response voltage waveform has substantial voltage at the end of said response time period.

5. A high power, switch mode radio frequency power amplifier to provide power to a load as described in claim 4 wherein said varactor capacitor is substantial.

6. A high power, switch mode radio frequency power amplifier to provide power to a load comprising:
   a. a radio frequency driver;
   b. a means for switching responsive to said driver wherein said means for switching operates rapidly and is capable of alternatingly establishing a conductive state for a conductive time period and a non-conductive state for a response time period;
   c. a means for providing a supply voltage to said switch;
   d. a means for conditioning responsive to said supply voltage wherein said means for conditioning acts to create a response voltage waveform wherein said response waveform has a time-varying voltage during said response time period and wherein said response voltage waveform has substantial voltage at the end of said response time period and wherein the voltage of said response waveform at said turn-on time is approximately 50% of said supply voltage.

7. A high power, switch mode radio frequency power amplifier to provide a level of power to a load comprising:

a. a radio frequency driver;

b. a means for switching responsive to said driver wherein said means for switching operates rapidly and is capable of alternatingly establishing a conductive state for a conductive time period and a non-conductive state for a response time period;

c. a means for providing a supply voltage to said switch;

d. a means for conditioning responsive to said supply voltage wherein said means for conditioning acts to create a maximum switch voltage during said response time period; and e. a means for reducing the maximum switch voltage during said response time period while maintaining said level of power to said load.

8. A high power, switch mode radio frequency power amplifier to provide a level of power to a load comprising:

a. a radio frequency driver;

b. a means for switching responsive to said driver wherein said means for switching operates rapidly and is capable of alternatingly establishing a conductive state for a conductive time period and a non-conductive state for a response time period;

c. a means for providing a supply voltage to said switch;

d. a means for conditioning responsive to said supply voltage wherein said means for conditioning acts to create a maximum switch voltage during said response time period; and e. a means for increasing said level of power provided to said load without increasing said maximum switch voltage.

9. A high power, switch mode radio frequency power amplifier to provide power to a load as described in claim 7 wherein said means for conditioning acts to create a response voltage waveform, wherein said response waveform has a time-varying voltage during said response time period and wherein said response voltage waveform has substantial voltage at the end of said response time period.

10. A high power, switch mode radio frequency power amplifier to provide power to a load as described in claim 8 wherein said means for conditioning acts to create a response voltage waveform, wherein said response waveform has a time-varying voltage during said response time period and wherein said response voltage waveform has substantial voltage at the end of said response time period.

* * * * *